US009269793B2

(12) United States Patent
Brown et al.

(10) Patent No.: US 9,269,793 B2
(45) Date of Patent: Feb. 23, 2016

(54) METHOD AND SYSTEM FOR A GALLIUM NITRIDE SELF-ALIGNED VERTICAL MESFET

(71) Applicant: Avogy, Inc., San Jose, CA (US)

(72) Inventors: Richard J. Brown, Los Gatos, CA (US); Isik C. Kizilyalli, San Francisco, CA (US); Hui Nie, Cupertino, CA (US); Andrew P. Edwards, San Jose, CA (US); David P. Bour, Cupertino, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 14/489,761

(22) Filed: Sep. 18, 2014

(65) Prior Publication Data
US 2015/0179772 A1    Jun. 25, 2015

Related U.S. Application Data

(62) Division of application No. 13/335,572, filed on Dec. 22, 2011, now Pat. No. 8,866,147.

(51) Int. Cl.
*H01L 29/20*    (2006.01)
*H01L 21/20*    (2006.01)
(Continued)

(52) U.S. Cl.
CPC ...... *H01L 29/66856* (2013.01); *H01L 21/0254* (2013.01); *H01L 21/02647* (2013.01); *H01L 21/32* (2013.01); *H01L 29/2003* (2013.01);
(Continued)

(58) Field of Classification Search
CPC .............. H01L 29/8083; H01L 29/812; H01L 29/8122; H01L 29/66068; H01L 29/66856; H01L 29/2003; H01L 29/1608; H01L 29/1066; H01L 21/0256; H01L 21/02647; H01L 21/32
USPC .............. 257/76, 77, 135, 256, 335, E29.313, 257/E29.262, E29.068, E29.059, E21.45, 257/E21.338, E21.09; 438/173, 192, 473, 438/478
See application file for complete search history.

(56) References Cited

U.S. PATENT DOCUMENTS 6,403,456 B1    6/2002 Plat et al.
8,058,655 B2 *  11/2011 Sheridan et al. ................ 257/77
(Continued)

FOREIGN PATENT DOCUMENTS

WO    WO 2013/095847 A1    6/2013

OTHER PUBLICATIONS

Notification of Transmittal of the International Search Report and the Written Opinion of the International Searching Authority, or the Declaration and International Search Report and Written Opinion of the International Searching Authority for International Application No. PCT/US2012/065954 mailed on Feb. 4, 2013, 10 pages.
(Continued)

*Primary Examiner* — Dao H Nguyen
(74) *Attorney, Agent, or Firm* — Kilpatrick Townsend & Stockton LLP

(57) ABSTRACT

A semiconductor structure includes a III-nitride substrate and a drift region coupled to the III-nitride substrate along a growth direction. The semiconductor substrate also includes a channel region coupled to the drift region. The channel region is defined by a channel sidewall disposed substantially along the growth direction. The semiconductor substrate further includes a gate region disposed laterally with respect to the channel region.

21 Claims, 9 Drawing Sheets

(51) Int. Cl.
*H01L 21/332* (2006.01)
*H01L 29/66* (2006.01)
*H01L 29/812* (2006.01)
*H01L 29/808* (2006.01)
*H01L 21/02* (2006.01)
*H01L 21/32* (2006.01)
*H01L 29/36* (2006.01)
*H01L 29/47* (2006.01)
*H01L 29/10* (2006.01)
*H01L 29/16* (2006.01)

(52) U.S. Cl.
CPC .............. *H01L 29/36* (2013.01); *H01L 29/475* (2013.01); *H01L 29/8083* (2013.01); *H01L 29/812* (2013.01); *H01L 29/8122* (2013.01); *H01L 29/1066* (2013.01); *H01L 29/1608* (2013.01)

(56) References Cited

U.S. PATENT DOCUMENTS

| | | | |
|---|---|---|---|
| 8,716,078 B2 * | 5/2014 | Disney et al. | 438/186 |
| 2004/0217375 A1 | 11/2004 | Yokogawa et al. | |
| 2007/0164321 A1 | 7/2007 | Sheppard et al. | |
| 2007/0298559 A1 * | 12/2007 | Brar et al. | 438/197 |
| 2009/0315037 A1 | 12/2009 | Kikkawa | |
| 2011/0127604 A1 | 6/2011 | Sato | |
| 2013/0032813 A1 | 2/2013 | Kizilyalli et al. | |
| 2013/0112985 A1 | 5/2013 | Kizilyalli et al. | |
| 2013/0153917 A1 * | 6/2013 | Romano et al. | 257/76 |
| 2013/0161635 A1 | 6/2013 | Brown et al. | |

OTHER PUBLICATIONS

Non-Final Office Action for U.S. Appl. No. 13/335,572 mailed on Dec. 6, 2013, 9 pages.

Notice of Allowance for U.S. Appl. No. 13/335,572 mailed on Jun. 19, 2014, 7 pages.

* cited by examiner

METHOD AND SYSTEM FOR A GALLIUM NITRIDE SELF-ALIGNED VERTICAL MESFET

CROSS-REFERENCES TO RELATED APPLICATIONS

This application is a division of U.S. patent application Ser. No. 13/335,572, filed Dec. 22, 2011, which is commonly assigned and the disclosure of which is hereby incorporated by reference in its entirety.

The following regular U.S. patent applications are hereby incorporated by reference into this application for all purposes:
  application Ser. No. 13/198,655, filed Aug. 4, 2011, entitled "METHOD AND SYSTEM FOR GAN VERTICAL JFET UTILIZING A REGROWN GATE";
  application Ser. No. 13/198,659, filed Aug. 4, 2011, entitled "METHOD AND SYSTEM FOR A GAN VERTICAL JFET UTILIZING A REGROWN CHANNEL"; and
  application Ser. No. 13/198,666, filed Aug. 4, 2011, entitled "METHOD AND SYSTEM FOR FORMATION OF P-N JUNCTIONS IN GALLIUM NITRIDE BASED ELECTRONICS".

BACKGROUND OF THE INVENTION

Power electronics are widely used in a variety of applications. Power electronic devices are commonly used in circuits to modify the form of electrical energy, for example, from ac to dc, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to forming a vertical metal-semiconductor field-effect transistor (MESFET). Merely by way of example, the invention has been applied to methods and systems for manufacturing vertical MESFETs using gallium-nitride (GaN) based epitaxial layers. The methods and techniques can be applied to a variety of compound semiconductor systems including n-channel and p-channel vertical MESFETs, which can provide either normally-off or normally-on functionality.

According to an embodiment of the present invention, a method for fabricating a vertical metal-semiconductor field-effect transistor (MESFET) is provided. The method includes providing a gallium nitride (GaN) substrate and forming a first n-type GaN epitaxial layer coupled to the GaN substrate, a second n-type GaN epitaxial layer coupled to the first n-type GaN epitaxial layer, and a third n-type GaN epitaxial layer coupled to the second n-type GaN epitaxial layer. The method also includes forming a metallic contact electrically coupled to the third n-type GaN epitaxial layer and removing at least a portion of the third n-type GaN epitaxial layer to form a source region. The method further includes forming a plurality of sacrificial layers coupled to the second n-type GaN epitaxial layer, patterning the plurality of sacrificial layers to provide an etch mask coupled to the second n-type GaN epitaxial layer, forming a self-aligned channel region, and forming one or more Schottky metal structures coupled to the self-aligned channel region.

According to another embodiment of the present invention, a method for fabricating a controlled switching device is provided. The method includes providing a III-nitride substrate and forming a plurality of III-nitride epitaxial layers coupled to the III-nitride substrate. The method also includes forming a source contact coupled to one of the plurality of III-nitride epitaxial layers, patterning the one of the plurality of III-nitride epitaxial layers to form a source region, and forming a first sacrificial layer, a second sacrificial layer, and third sacrificial layer. The first sacrificial layer is coupled to another of the plurality of III-nitride epitaxial layers. The method further includes patterning the third sacrificial layer to form a hardmask, patterning the second sacrificial layer, patterning the first sacrificial layer, using the hardmask, to form a second hardmask, patterning the another of the plurality of III-nitride epitaxial layers, using the second hardmask, to form a channel region, and performing a metal lift-off process, using the hardmask, to form gate contacts.

According to an alternative embodiment of the present invention, a semiconductor structure is provided. The semiconductor structure includes a III-nitride substrate and a drift region coupled to the III-nitride substrate along a growth direction. The semiconductor structure also includes a channel region coupled to the drift region. The channel region is defined by a channel sidewall disposed substantially along the growth direction. The semiconductor structure further includes a gate region disposed laterally with respect to the channel region.

Numerous benefits are achieved by way of the present invention over conventional techniques. For example, embodiments of the present invention enable the use of thicker III-nitride semiconductor layers in comparison with conventional techniques, which can result in devices capable of operating at higher voltages than conventional devices. Additionally, embodiments of the present invention provide vertical transistor structures, which can allow devices to have greater power density, lower capacitance, and generally better performance. Furthermore, the vertical transistor structures provided herein can utilize a Schottky metal gate rather than a semiconductor gate, allowing for metal deposition processes to be utilized instead of regrowth and/or other processes involving semiconductor formation. These and other embodiments of the invention, along with many of its advantages and features, are described in more detail in conjunction with the text below and attached figures.

DETAILED DESCRIPTION OF SPECIFIC EMBODIMENTS

Figure 1A:
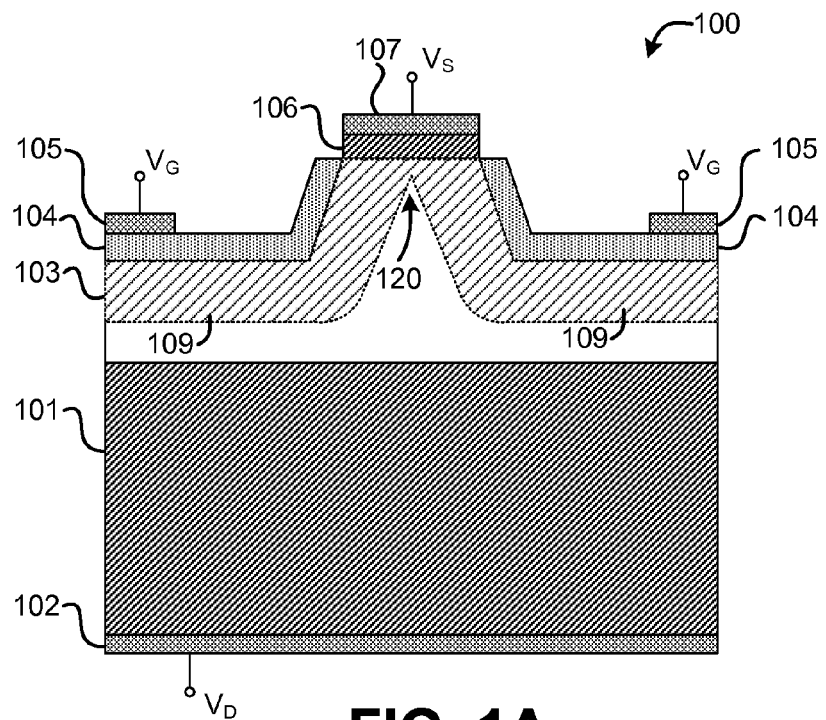
FIGS. 1A-1B are simplified cross-sectional diagrams illustrating the operational functionality of a vertical MESFET according to an embodiment of the present invention.

Embodiments of the present invention relate to electronic devices. More specifically, the present invention relates to forming a vertical metal-semiconductor field-effect transistor (MESFET). Merely by way of example, the invention has been applied to methods and systems for manufacturing vertical MESFETs using gallium-nitride (GaN) based epitaxial layers. The methods and techniques can be applied to a variety of compound semiconductor systems including n-channel and p-channel vertical MESFETs, which can provide either normally-off or normally-on functionality.

GaN-based electronic and optoelectronic devices are undergoing rapid development. Desirable properties associated with GaN and related alloys and heterostructures include high bandgap energy for visible and ultraviolet light emission, favorable transport properties (e.g., high electron mobility and saturation velocity), a high breakdown field, and high thermal conductivity. According to embodiments of the present invention, gallium nitride (GaN) epitaxy on pseudo-bulk GaN substrates is utilized to fabricate vertical GaN-based semiconductor devices not possible using conventional techniques. For example, conventional methods of growing GaN include using a foreign substrate such as silicon carbide (SiC). This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create vertical devices, including power electronic devices such as MESFETs and other field-effect transistors.

Homoepitaxial GaN layers on bulk GaN substrates, on the other hand, are utilized in the embodiments described herein to provide superior properties to conventional techniques and devices. For instance, electron mobility, μ, is higher for a given background doping level, N. This provides low resistivity, ρ, because resistivity is inversely proportional to electron mobility, as provided by equation (1):

$$\rho = \frac{1}{q\mu N}, \quad (1)$$

where q is the elementary charge.

Another superior property provided by homoepitaxial GaN layers on bulk GaN substrates is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by the equation:

$$R = \frac{\rho L}{A}, \quad (2)$$

where A is the cross-sectional area of the channel or current path.

In general, a tradeoff exists between the physical dimension of a device needed to support high voltage in a device's off-state and the ability to pass current through the same device with low resistance in the on-state. In many cases GaN is preferable over other materials in minimizing this tradeoff and maximizing performance. In addition, GaN layers grown on bulk GaN substrates have low defect density compared to layers grown on mismatched substrates. The low defect density will give rise to superior thermal conductivity, less trap-related effects such as dynamic on-resistance, and better reliability.

Among the vertical device structures contemplated is a vertical MESFET. Depending on doping levels, physical dimensions, conductivity type (e.g., n-type or p-type materials), and other factors, vertical MESFETs can be designed to have normally-off or normally-on functionality. A normally-off vertical MESFET is particularly useful due to its ability to prevent current flow if no voltage is applied to the gate, which can serve as, among other things, a safety feature for vertical MESFETs used in power applications.

A normally-off vertical MESFET can be created in various ways. For example, an n-type current path from source to drain can be gated on either side by Schottky gates. With sufficiently low background doping, and high barrier height in the Schottky gates, the channel can be depleted of carriers, or pinched off at zero bias. When a positive voltage is applied to the gate(s), the channel can be re-opened to turn the device on. Thus, in embodiments of the present invention, the vertical MESFET is referred to as a vertical metal-semiconductor field effect transistor since the current flows vertically between the source and drain through the gated region.

In addition to the ability to support high-voltage, low-resistance MESFET applications, the GaN vertical MESFETs described herein can differ from traditional lateral MESFETs in other ways. For example, other semiconductors used to manufacture vertical MESFETs, such as Si, GaAs, or SiC can be utilized, altering the mode of manufacture. Furthermore, the use of GaN epitaxial layers can allow for non-uniform dopant concentrations along an epitaxial growth direction as a function of thickness within the various layers of the vertical MESFET, which can optimize the performance of the device.

Figure 1B:
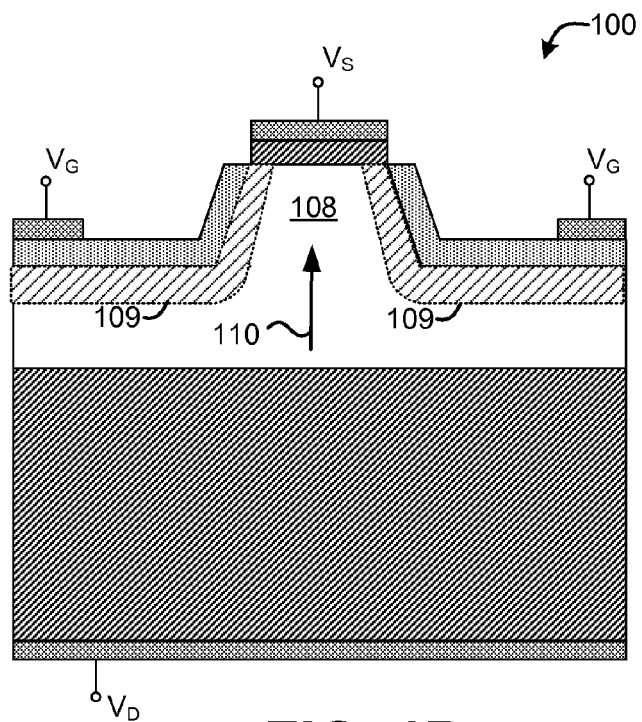

FIGS. 1A-1B are simplified cross-sectional diagrams illustrating the operational functionality of a vertical MESFET 100 according to an embodiment of the present invention. Referring to FIG. 1A, a drain 101 is provided. According to the embodiment of the present invention illustrated in FIG. 1A, the substrate is an n-type GaN substrate, but the present invention is not limited to this particular material. In other embodiments, substrates with p-type doping are utilized. Additionally, although a GaN substrate is illustrated in FIG. 1A, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, and quaternary III-V (e.g., III-nitride) materials such as AlInGaN are included within the scope of the present invention. Additionally, embodiments can use materials having an opposite conductivity type to provide devices with different functionality. For example, embodiments provided herein focus on the formation of a MESFET with an n-type drain and channel regions. However, a p-type MESFET can be formed by using materials with opposite conductivity (e.g., substituting p-type materials for n-type materials, and vice versa) in a similar manner as will be evident to one of skill in the art.

Coupled to the drain 101, is a drift region 103 of n-type GaN material. The drift region 103 provides a medium through which current can flow in the device's on-state in a vertical direction from the drain to a channel region 108 coupled to the drift region 103. In the off-state, the drift region provides a medium for supporting the electric field created by the voltage gradient between the source or gate and the drain. The channel region 108 also can comprise an n-type GaN material that is as wide as possible to minimize added resistance when the vertical MESFET 100 is turned on, but narrow enough to provide adequate current pinch off when the vertical MESFET 100 is turned off. The channel region 108 is coupled to a source 106 comprising a heavily-doped n-type GaN material.

At least partially surrounding the channel region 108 is a metal forming a gate 104 region, which can be coupled to at least a portion of the drift region 103 as shown. The metal of the gate 104 and the n-type materials of the channel region 108 and drift region 103 form a Schottky junction with corresponding depletion regions 109. Finally, contacts 102, 105, and 107, formed from one or more layers of electrical conductors including a variety of metals can be provided on the drain 101, gate 104, and source 106, respectively, to electrically couple the vertical MESFET 100 to an electrical circuit (not illustrated).

The operation of the vertical MESFET 100 is described as follows. FIG. 1A shows the vertical MESFET turned off, which can be a default mode of operation. As illustrated in FIG. 1A, the depletion regions 109 overlap at location 120 in the channel, preventing current flow through the channel region from the drain 101 to the source 106.

FIG. 1B shows the vertical MESFET turned on, meaning the depletion regions 109 are separated, allowing current to flow in a vertical direction 110 from the drain 101 through the drift region 103 and channel region 108 to the source 106 when voltages $V_D$ and $V_S$ are applied to the drain contact 102 and source contact 107, respectively. In this embodiment, application of a voltage $V_G$ applied to the gate 104 turns the vertical MESFET on by decreasing the size of the depletion regions 109 and thereby providing a current path through the channel region 108.

Whether the vertical MESFET 100 is normally-on or normally off can depend on different features of the vertical MESFET 100, such as the width of the channel region 108, dopant concentrations in the channel region 108 and the gate barrier height, and the like. For example, a normally-on vertical MESFET can be formed if the channel region is sufficiently wide and/or the dopant concentrations are high enough, in which case the depletion regions 109 may not pinch off the current when voltage $V_G$ applied to the gate 104 is 0 V. The normally-on vertical MESFET 100 can be turned off when $V_G$ reaches a negative threshold voltage. Alternatively, for a normally-off vertical MESFET, the channel is pinched off when $V_G$ is 0 V, and the normally-off vertical MESFET 100 can be turned on when $V_G$ reaches a positive threshold voltage.

FIGS. 2-9 illustrate a process for creating a first type of vertical MESFET that utilizes etching of an epitaxial layer to form the channel of the vertical MESFET.

Figure 2:
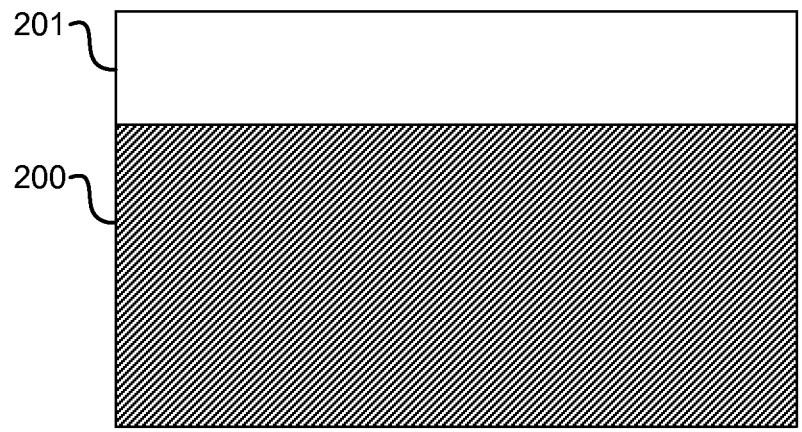
FIGS. 2-12 are simplified cross-sectional diagrams illustrating the fabrication of a vertical metal-semiconductor field-effect transistor (MESFET) according to an embodiment of the present invention.

Referring to FIG. 2, a first GaN epitaxial layer 201 is formed on a GaN substrate 200. As indicated above, the GaN substrate 200 can be a pseudo-bulk GaN material on which the first GaN epitaxial layer 201 is grown. Dopant concentrations (e.g., doping density) of the GaN substrate 200 can vary. For example, a GaN substrate 200 can have an n+ conductivity type, with dopant concentrations ranging from $1 \times 10^{17}$ cm$^{-3}$ to $1 \times 10^{19}$ cm$^{-3}$. Although the GaN substrate 200 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the first GaN epitaxial layer 201 can also vary, depending on desired functionality. The first GaN epitaxial layer 201 can serve as a drift region for the vertical MESFET 100, and therefore can be a relatively low-doped material. For example, the first GaN epitaxial layer 201 can have an n− conductivity type, with dopant concentrations ranging from $1 \times 10^{14}$ cm$^{-3}$ to $1 \times 10^{18}$ cm$^{-3}$. Furthermore, the dopant concentration can be uniform, or can vary, for example, as a function of the thickness of the drift region.

The thickness of the first GaN epitaxial layer 201 can also vary substantially, depending on the desired functionality. As discussed above, homoepitaxial growth can enable the first GaN epitaxial layer 201 to be grown far thicker than layers formed using conventional methods. In general, in some embodiments, thicknesses can vary between 0.5 μm and 100 μm, for example, thicknesses greater than 5 μm. Resulting breakdown voltages for the vertical MESFET 100 can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Different dopants can be used to create n- and p-type GaN epitaxial layers and structures disclosed herein. For example, n-type dopants can include silicon, oxygen, or the like. P-type dopants can include magnesium, beryllium, zinc, or the like.

Figure 3:
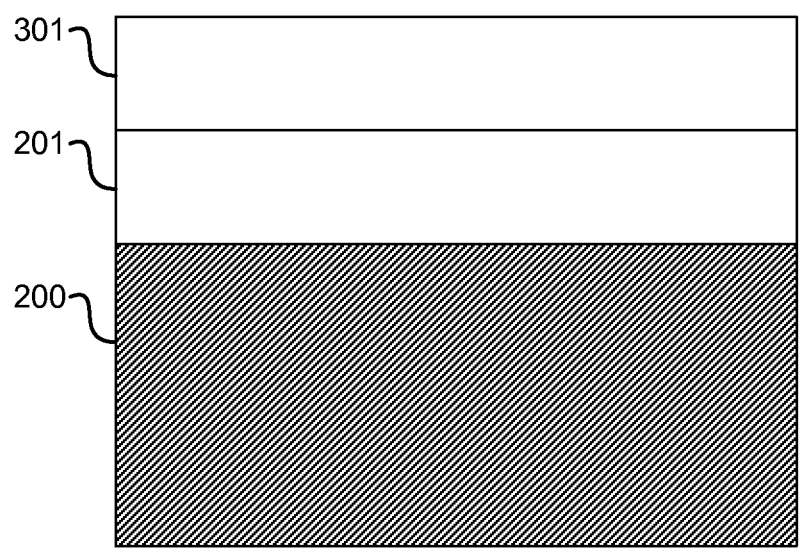

FIG. 3 illustrates the formation of a second GaN epitaxial layer 301 above the first GaN epitaxial layer 201. The second GaN epitaxial layer 301, which eventually comprises the channel of the vertical MESFET 100, can have a low dopant concentration. In many embodiments, the dopant concentration of the second GaN epitaxial layer 301 can be equal to or less than the dopant concentration of the first GaN epitaxial layer 201, depending on the desired threshold voltage for the vertical MESFET 100. Additionally, the second GaN epitaxial layer 301 can be the same conductivity type as the first GaN epitaxial layer 201. As discussed in relation to the first GaN epitaxial layer 201, and is as applicable to subsequent layers, adhesion layers, buffer layers, and the like, can be utilized during the epitaxial growth as appropriate to the particular device structure fabricated.

The thickness of the second GaN epitaxial layer 301 can also vary depending on the desired functionality. In some embodiments, thicknesses can be between 0.25 μm and 10 μm. In other embodiments, the thickness of the second GaN epitaxial layer 301 can be between 0.5 μm and 5 μm.

Similar to the first GaN epitaxial layer 201, the dopant concentration of the second GaN epitaxial layer 301 can be uniform or non-uniform. In some embodiments, dopant concentration can vary with the thickness of the second GaN epitaxial layer 301. For example, dopant concentration in the second GaN epitaxial layer 301 can increase as the distance from the first GaN epitaxial layer 201 increases. In other embodiments, the doping may be modulated between two or more values, or undoped regions, resulting in the desired average doping concentration for the layer.

Figure 4:
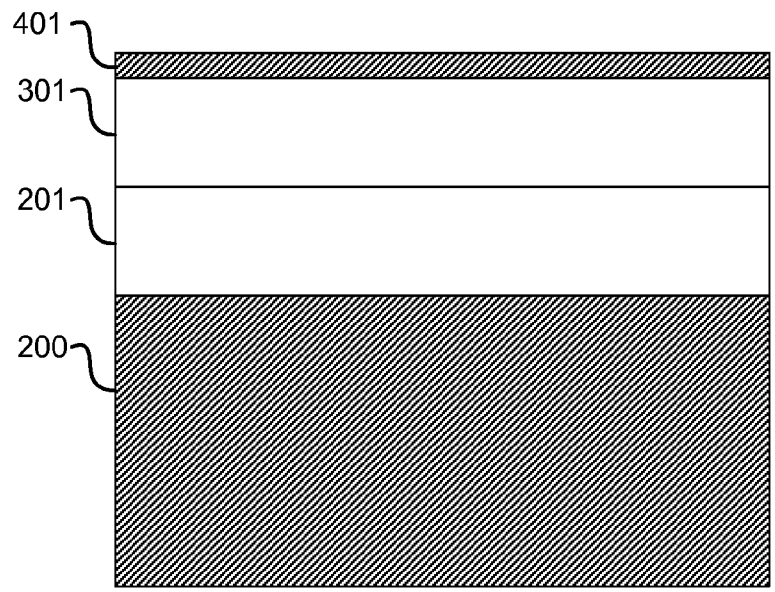

FIG. 4 illustrates the formation of a third GaN epitaxial layer 401 above the second GaN epitaxial layer 301. The third GaN epitaxial layer 401, which eventually can comprise the source of the vertical MESFET 100, can be a highly-doped epitaxial layer of the same conductivity type as the first and second GaN epitaxial layers 201, 301. In general, the dopant concentration of the third GaN epitaxial layer 401 can exceed the dopant concentrations of the first and second GaN epitaxial layers 201, 301. For example, an n-type dopant concentration of the third GaN epitaxial layer 401 can be equal to or greater than $1 \times 10^{18}$ cm$^{-3}$.

The thickness of the third GaN epitaxial layer 401 can impact the contact resistance and current flow properties of the vertical MESFET 100. In some embodiments, thicknesses can be between 500 Å and 5 μm, for example 2 μm. In other embodiments, the thickness of the third GaN epitaxial layer 401 can be 0.2 μm, or between 0.05 μm and 0.7 μm.

Figure 5:
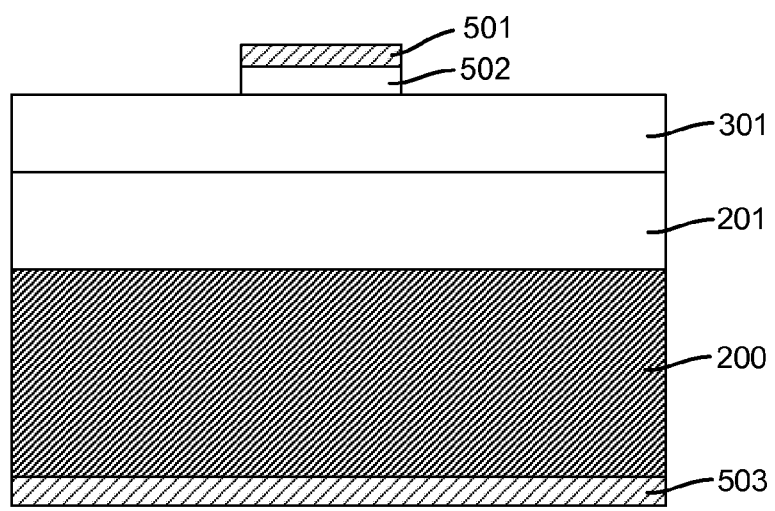

FIG. 5 illustrates the formation of a metallic structure 501 on top of the third GaN epitaxial layer 401. The metallic structure 501 can be one or more layers of Ohmic metal that serve as a contact for the source of the vertical MESFET 100. For example, the metallic structure 501 can comprise a titanium-aluminum (Ti/Al) ohmic metal. Other metals and/or alloys can be used including, but not limited to, aluminum, nickel, gold, combinations thereof, or the like. After the formation of metal structure 501, the portion of n+GaN contact layer 401 that is not covered by 501 is removed, for example, by using an etching process. Inductively-coupled plasma (ICP) etching and/or other common GaN etching processes can be used.

As illustrated in FIG. 5, the formation of metallic structure 501 is accompanied by the removal of a portion of third GaN epitaxial layer 401 to form source region 502. As illustrated in FIG. 5, the removal process used to form source region 502 terminates at the top of second GaN epitaxial layer 301, but this is not required by embodiments of the present invention. In other embodiments, the removal process, for example, an etching process, extends a predetermined distance into second GaN epitaxial layer 301. One of ordinary skill in the art would recognize many variations, modifications, and alternatives.

FIG. 5 also illustrates the formation of a metallic structure 503 below the GaN substrate 200. The metallic structure 503 can be one or more layers of Ohmic metal that serve as a contact for the drain of the vertical MESFET 100. For example, the metallic structure 503 can comprise a titanium-aluminum (Ti/Al) ohmic metal. Other metals and/or alloys can be used including, but not limited to, aluminum, nickel, gold, combinations thereof, or the like. In some embodiments, an outermost metal of the metallic structure 503 can include gold, tantalum, tungsten, palladium, silver, or aluminum, combinations thereof, and the like. The metallic structure 503 can be formed using any of a variety of methods such as sputtering, evaporation, or the like.

Figure 6:
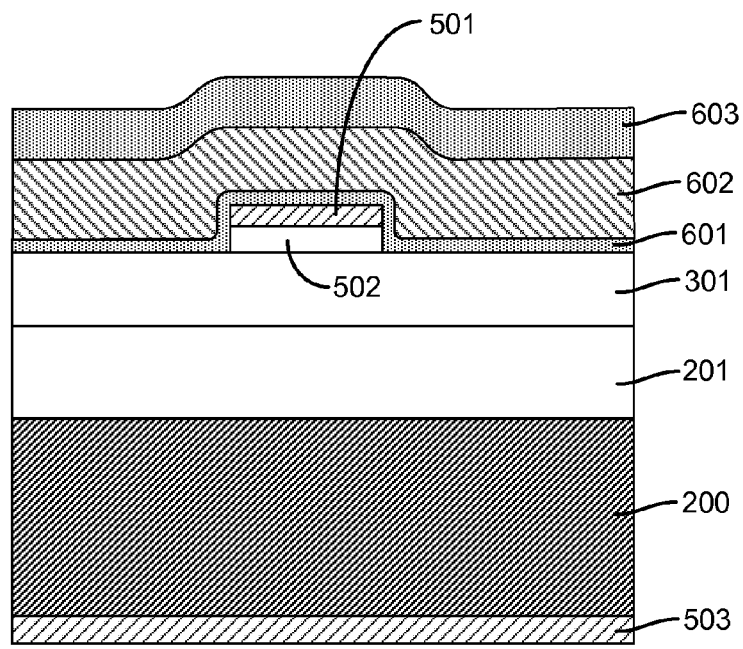

FIG. 6 is simplified cross-section diagram illustrating the deposition of three sacrificial layers 601, 602, and 603. The first sacrificial layer 601 includes a dielectric layer that is used to protect metallic structure 501 and source region 502 during subsequent process steps. For example, the first sacrificial layer 601 can comprise silicon oxide (SiO$_x$) or silicon nitride (Si$_x$N$_y$), silicon oxynitrides, combinations thereof, or the like. In the illustrated embodiment, first sacrificial layer 601 is a conformal layer having a predetermined thickness, for example, 500 nm. In other embodiments, the thickness and materials can vary depending on the particular application. The second and third sacrificial layers 602 and 603 are deposited after layer 601 and provide protection in addition to the first sacrificial layer. In an embodiment, the second sacrificial layer 602 comprises a metal, for example, chromium with a thickness of 100 nm. Other thicknesses and materials can be used in other embodiments depending on the particular application. The second sacrificial layer can be a conformal layer, a planarizing layer, or a partially planarizing layer. The third sacrificial layer 603 is typically another dielectric layer, sharing some common features with the first sacrificial layer 601. In an embodiment, the third sacrificial layer includes one or more dielectric materials such as silicon oxide, silicon oxynitride, silicon nitride, spin on glass, combinations thereof, or the like. In a particular embodiment, the third sacrificial layer is a planarizing layer of silicon oxide with a thickness of 500 nm.

Figure 7:
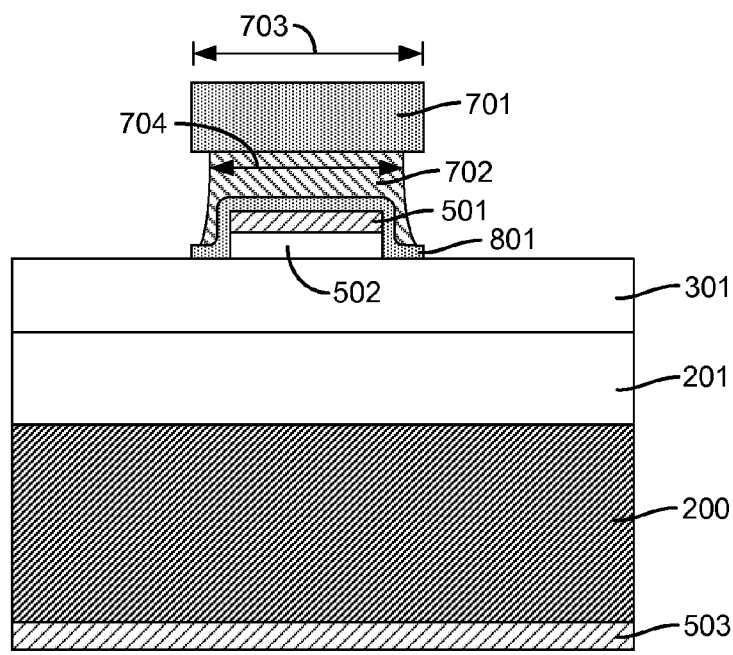

FIG. 7 is a simplified cross-sectional diagram illustrating the removal at least a portion of third sacrificial layer 603 and second sacrificial layer 602 to form structure 701 and structure 702. As illustrated in FIG. 7, the width 703 of structure 701 is slightly larger than the width 704 of structure 702. In some embodiments, the undercutting used to form structure 702 is a wet etch (e.g., a wet etch of the chrome). As illustrated in FIG. 7, the smaller width 704 in comparison with width 703 provides a reentrant profile for later processing steps. Structure 701 can be referred to as a dielectric hardmask and can be formed using reactive ion etching. The processes used to remove portions of the third sacrificial layer 603 and a portion of the second sacrificial layer 602 typically include masking and etching processes, for example, a metal removal process to remove portions of the second sacrificial layer 602, terminating the etch at the first sacrificial layer 601.

Referring to FIG. 7, portions of the first sacrificial layer 601 are masked and etched to form an etch mask 801. In some embodiments, etch mask 801 is formed using structure 701 as an etch mask to pattern the first sacrificial layer 601. As an example, a dry etch process can be used to form etch mask 801.

Figure 8:
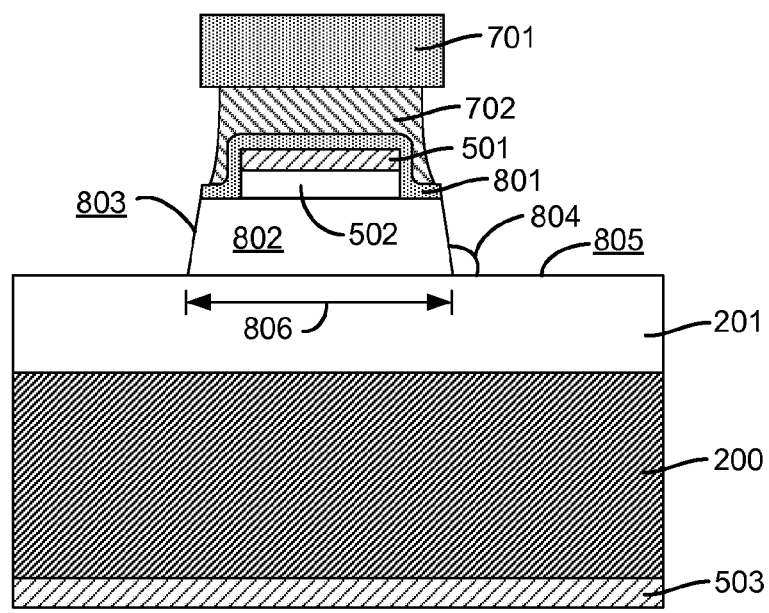

FIG. 8 is a simplified cross-sectional diagram illustrating the removal at least a portion of the second GaN epitaxial layer 301 to form the channel region 802. In the embodiment illustrated in FIG. 8, etch mask 801 is used in an etching process to remove portions of the second GaN epitaxial layer 301, thereby forming channel region 802.

As illustrated in FIG. 8, the source region 502 and the channel region 802 are formed from the third and second GaN epitaxial layers, respectively In the illustrated embodiment, the channel formation etch terminates at the interface between the second GaN epitaxial layer 301 and the first GaN epitaxial layer 201. However, this is not required by embodiments of the present invention. Due to the similarities between the first GaN epitaxial layer 201 and the second GaN epitaxial layer 301, the etch may penetrate portions of the first GaN epitaxial layer 201 and/or fail to remove portions of the second GaN epitaxial layer 301 with negligible impact to the performance of the vertical MESFET 100. Inductively-coupled plasma (ICP) etching and/or other GaN etching processes can be used to form the structures illustrated in FIG. 8.

Depending on the processes used to form the channel region 802, the features of the resulting sidewalls 803 of the channel region 802 can vary. In some embodiments, the sidewall 803 can be vertical. In other embodiments, an outside angle 804 between the sidewall 803 and an upper surface 805 of the first GaN epitaxial layer 201 or other layer exposed by the removal process can be greater than 90°, in which case the cross-sectional profile of the channel region 802 can be trapezoidal, as shown in FIG. 8. An outside angle 804 of greater than 90° can facilitate formation of subsequent layers and result in improved performance by enabling better control of the electric field near the location where the sidewall 803 and upper surface 805 meet. In some embodiments, the removal profile (e.g., the etch profile) can produce a reentrant profile. One of ordinary skill in the art would recognize many variations, modifications, and alternatives.

The width 806 of channel region 802 (e.g., measured at the bottom of the channel) can vary, depending on numerous factors such as desired functionality of the vertical MESFET 100, dopant concentrations of channel region 802, as well as other factors. For example, for a normally-off vertical MESFET in which the channel region 802 has a dopant concentration between $1\times10^{14}$ cm$^{-3}$ and $1\times10^{17}$ cm$^{-3}$, the width 806 of the channel region 802 can be between 0.5 µm and 10 µm. In other embodiments, the width 806 of the channel region 802 can be less than 5 µm, less than 2 µm, or the like. For a normally-on vertical MESFET, the width 806 of the channel region 802 can be greater.

Figure 9:
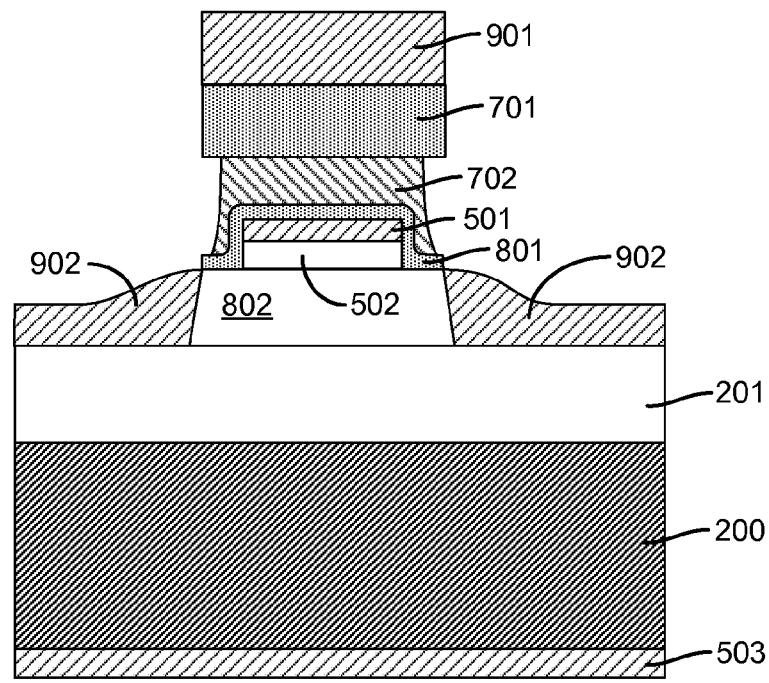

FIG. 9 illustrates the formation of a Schottky metal structure 902 using a lift-off process. The Schottky metal structure 902, which forms gate portions of the vertical MESFET 100, has a work function difference with respect to the channel region 802, which forms a Schottky barrier. For instance, if the channel region 802 is formed from an n-type GaN material, the Schottky metal structure 902 will be appropriate for a Schottky barrier on n-type GaN material, and if the channel is p-type, the Schottky metal structure 902 will be a suitable metal for a Schottky barrier on p-type GaN.

The thickness of the Schottky metal structure 902 can vary, depending on the required sheet resistance of the metal layer and the device design. In some embodiments, the thickness of the Schottky metal structure 902 is between 0.1 µm and 5 µm. In other embodiments, the thickness of the Schottky metal structure 902 is between 0.3 µm and 1 µm.

The Schottky metal structure 902 can have a relatively high barrier height, for example in a range from about 0.8 eV to about 2 eV. Some examples of metals with large barrier heights on GaN are nickel, platinum, palladium, and gold.

In some embodiments, the Schottky metal structure 902 that is used to form the gate region is a continuous deposition over portions of the device with other regions protected by the presence of the mask layers, for example structure 701 and structure 702. As illustrated in FIG. 9, metallic structure 501 and source region 502 are protected during metal deposition by structures 701 and 702, which can be used in a liftoff process to remove metal 901, which is deposited during formation of the Schottky metal structure 902. Referring to FIG. 9, the formation of the gate regions is self-aligned since the same mask 801 that was used to etch the channel is being used to lift off the gate metal. If the structure was illustrated in plan view (not shown) the gate metal could be additionally defined using a roughly aligned bilayer resist lift-off stack (to isolate individual devices). This can be referred to as a soft lift-off layer.

Figure 10:
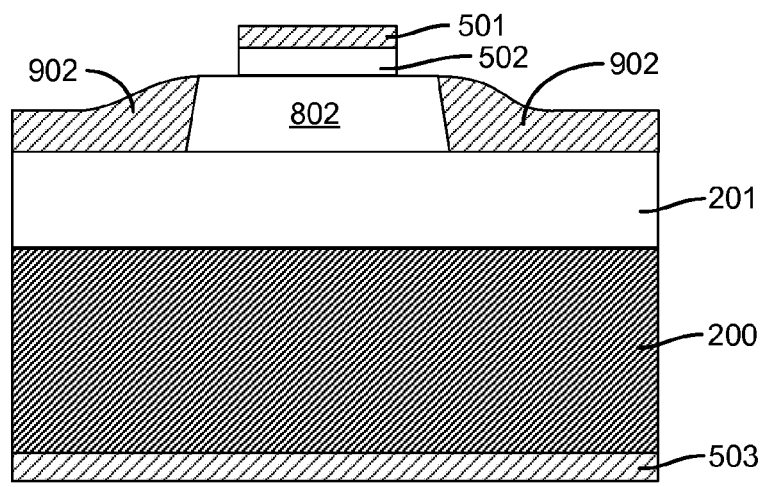

Referring to FIG. 10, a lift-off and subsequent etch process is used to remove structure 701 and 702 to expose the metallic structure 501 and source region 502 (e.g., removal of the soft lift-off layer in a solvent and the hard lift-off layer in appropriate acids or wet etchants). The self-aligning process illustrated in FIG. 10 allows the Schottky metal structure 902 to be accurately located in relation to the channel region 802 and the source region 502. One of ordinary skill in the art would recognize many variations, modifications, and alternatives.

Figure 11:
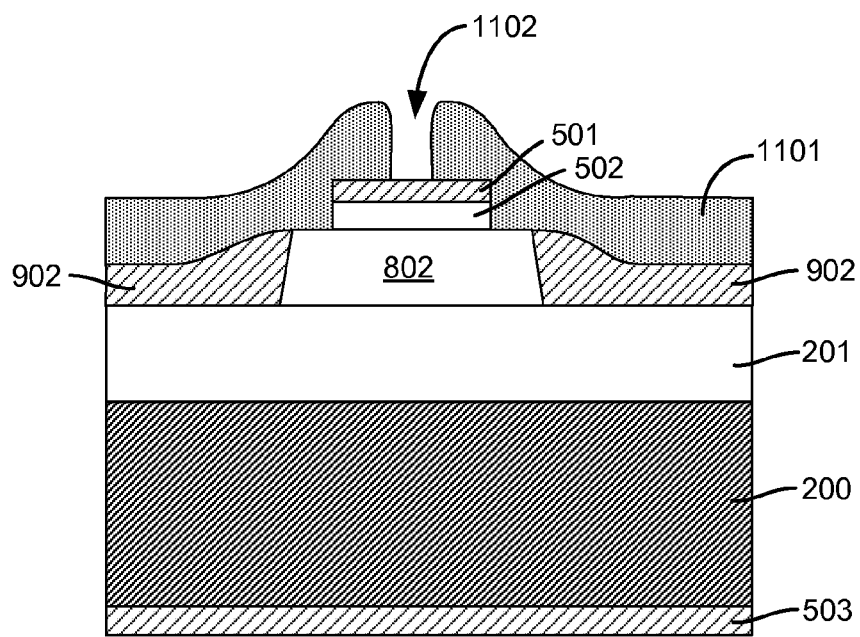

FIG. 11 illustrates the formation of dielectric layer 1101 and subsequent contact via opening 1102 on top of the source metal structure 501 (for purposes of clarity, the mask is not shown in FIG. 11). The dielectric layer 1101 can include silicon oxide, silicon nitride, other dielectric materials, combinations thereof, or the like and can serve as a passivating intermetallic dielectric layer.

Figure 12:
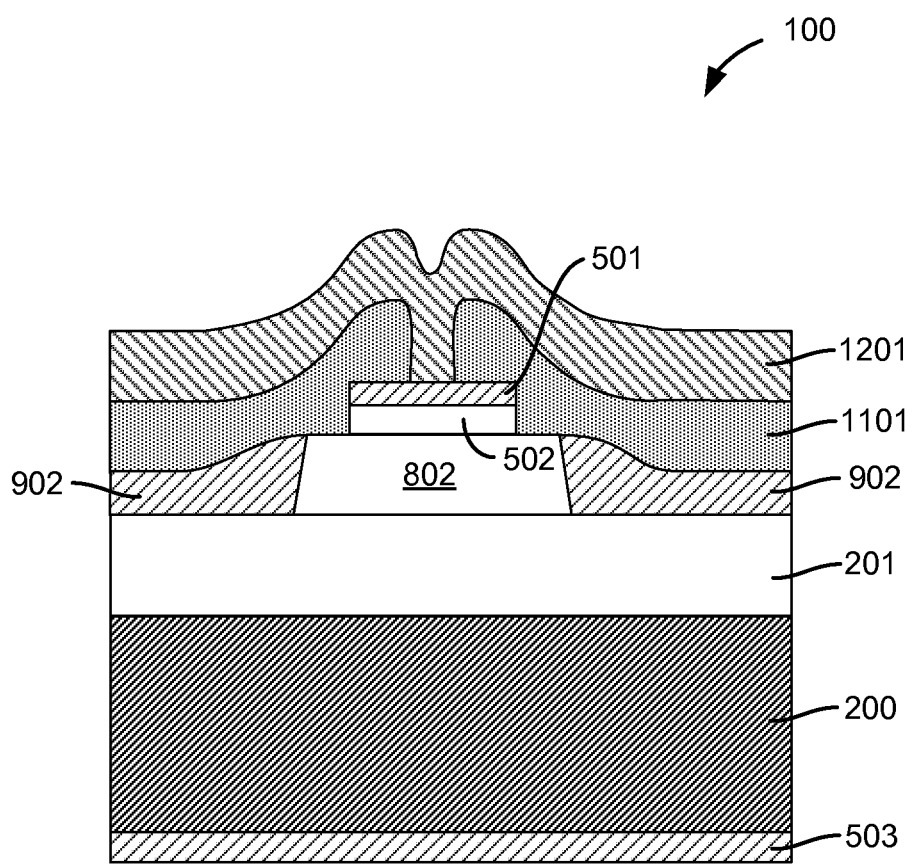

FIG. 12 illustrates the formation of an additional metallic structure 1201 to provide an electrical connection to source metal structure 501. The additional metallic structure 1201 can include one or more layers of metals to serve as electrical routing layers or as a suitable surface for probes, wirebonds, solder, or the like to the vertical MESFET 100. The additional metallic structure 1201 can be formed using a variety of techniques, including plating, lift-off, and/or deposition with subsequent etching, which can vary depending on the metals used. Example metals include nickel, gold, aluminum, copper, tin or silver (Ni, Au, Al, Cu, Sn or Ag), and the like.

Referring to FIG. 12, the self-aligned channel region and gate formation process provides a semiconductor structure with unique characteristics. As illustrated in FIG. 12, the MESFET includes a III-nitride substrate 200 and a drift region coupled to the III-nitride substrate along a growth direction. The drift region includes the first epitaxial layer, which can have a thickness ranging from about 1 µm to 100 µm as appropriate for high voltage operation.

The MESFET also includes a self-aligned channel region coupled to the drift region. As illustrated in FIG. 8, the channel region 802 is defined by a channel sidewall 803 disposed substantially along the growth direction (i.e., the vertical direction). In some embodiments, the channel sidewall is angled with respect to the growth direction to form a reentrant profile (i.e., by an external angle greater than 90°. The gate region 902 is disposed laterally with respect to the channel region, which is in the horizontal direction as illustrated in FIG. 9. The first hardmask 701 is used to define the second hardmask 801, which, in turn, is used to define the channel region 802. The first hardmask 701 is also used, in conjunction with the reentrant structure 702, in the metal lift-off process. Therefore, the gate metal 902 (e.g., a Schottky metal structure) is self-aligned to the sides of the channel region. Because the second hardmask 801 covers the top surface of the channel region (extending laterally between the channel sidewalls), no metal is deposited on the top surface. Rather, the alignment of the gate regions to the channel is self-aligned, providing for increased process control.

The Schottky metal structure can include at least one of nickel, platinum, palladium, gold, combinations thereof, or the like. Additionally, the width of the channel region measured along a direction orthogonal to the growth direction can be less than 5 µm. Although not illustrated in FIG. 12, multiple devices can be fabricated in an array format, with the channel regions interspersed with the gate regions. One of ordinary skill in the art would recognize many variations, modifications, and alternatives.

Figure 13:
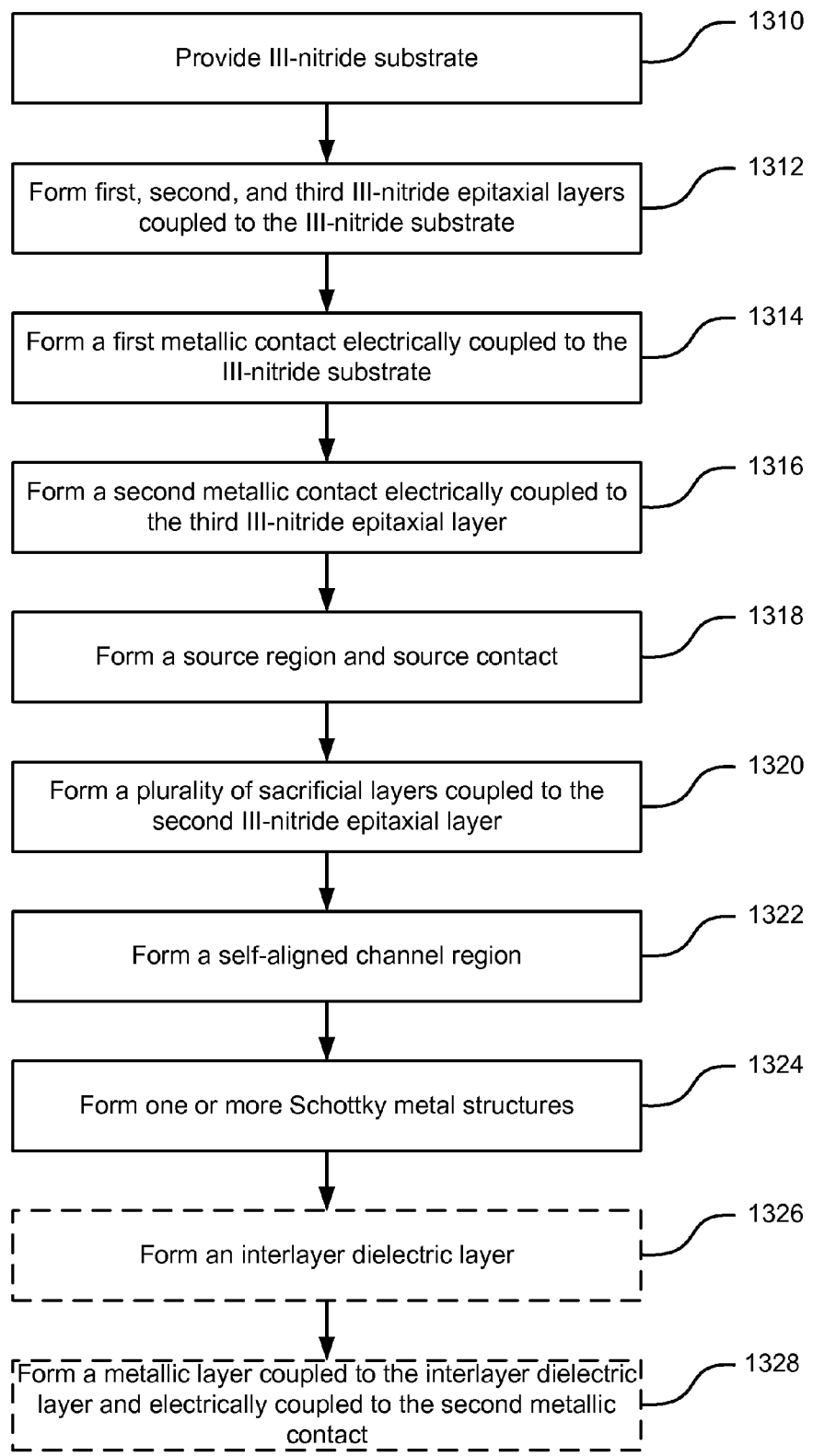
FIG. 13 is a simplified flowchart illustrating a method of fabricating a vertical MESFET according to an embodiment of the present invention.

FIG. 13 is a simplified flowchart illustrating a method of fabricating a vertical MESFET with a self-aligned gate region according to an embodiment of the present invention. In some embodiments, the vertical MESFET is referred to as a controlled switching device. Referring to FIG. 13, a III-nitride substrate is provided (1310). In an embodiment, the III-nitride is an n-type GaN substrate. The method also includes forming a first III-nitride epitaxial layer (e.g., an n-type GaN epitaxial layer) coupled to the III-nitride substrate, a second III-nitride epitaxial layer (e.g., an n-type GaN epitaxial layer) coupled to the first III-nitride epitaxial layer, and a third III-nitride epitaxial layer (e.g., an n-type GaN epitaxial layer) coupled to the second III-nitride epitaxial layer (1312).

The first III-nitride epitaxial layer is characterized by a first dopant concentration, for example n-type doping. Using the homoepitaxy techniques described herein, the thickness of the first III-nitride epitaxial layer can be thicker than available using conventional techniques, for example, between about 0.5 µm and about 100 µm, more particularly, between about 3 µm and 20 µm. The second III-nitride epitaxial layer has a second dopant concentration of the same type and less than or equal to the first dopant concentration, for example, n-type doping with a doping concentration lower than the first epitaxial layer. The third III-nitride epitaxial layer has a third dopant concentration of the same type and greater than the first dopant concentration, for example, an n-type layer with a higher doping concentration than the second epitaxial layer for Ohmic contact. As described herein, portions of the second III-nitride epitaxial layer are used in forming the channel region of the vertical MESFET and portions of the third III-nitride epitaxial layer are used in forming the source region of the vertical MESFET.

A first metallic contact electrically coupled to the III-nitride substrate is formed (1314) and a second metallic (e.g., ohmic) contact electrically coupled to the third III-nitride epitaxial layer is formed (1316). Optionally, a portion of the third III-nitride epitaxial layer not covered by the second metallic contact is removed. A source region is formed using a portion of the third III-nitride epitaxial layer and a source contact is formed using a portion of the second metallic contact (1318).

Subsequently, a plurality of sacrificial layers used to form sacrificial structures for the etch mask, lift-off mask and source metal protection are formed (1322). As illustrated in FIG. 7, the sacrificial layers are patterned and etched to provide an etch mask for the formation of the channel region. Thus, the method further includes removing at least a portion of the second III-nitride epitaxial layer to form a channel region (1322). The removal process can include a masking and etching process that can include physical etching components as well as chemical etching components. As illustrated in FIG. 8, the etch mask 801 used to form the channel region provides protection for the source region 502, enabling a self-aligned gate to be formed that is coupled to the channel region as described herein.

Additionally, the method includes forming one or more self-aligned Schottky metal structures coupled to the channel region (1324). These Schottky metal structures form gate regions at least partially surrounding the channel region previously fabricated. Referring to FIG. 9, the metallization process is self-aligned since sacrificial structure 701 was used to fabricate etch mask 801 that was used to define channel region 802. Thus, the metallization process forms the Schottky metal layer 902 so that it is self-aligned to the channel region 802. The method further includes optionally forming of an interlayer dielectric layer for interconnect purpose (1326), and subsequently optionally forming a metallic layer that is coupled to the interlayer dielectric layer and electrically coupled to the second metallic contact (i.e., the source contact) (1328). This metallic layer provides an electrical connection to the source contact as well for wirebond and interconnect purposes. It should be noted that the various epitaxial layers do not have to be uniform in dopant concentration as a function of thickness, but may utilize varying doping profiles as appropriate to the particular application.

It should be appreciated that the specific steps illustrated in FIG. 13 provide a particular method of fabricating a vertical MESFET with a self-aligned gate region according to an embodiment of the present invention. Other sequences of steps may also be performed according to alternative embodiments. For example, alternative embodiments of the present invention may perform the steps outlined above in a different order. Moreover, the individual steps illustrated in FIG. 13 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 14:
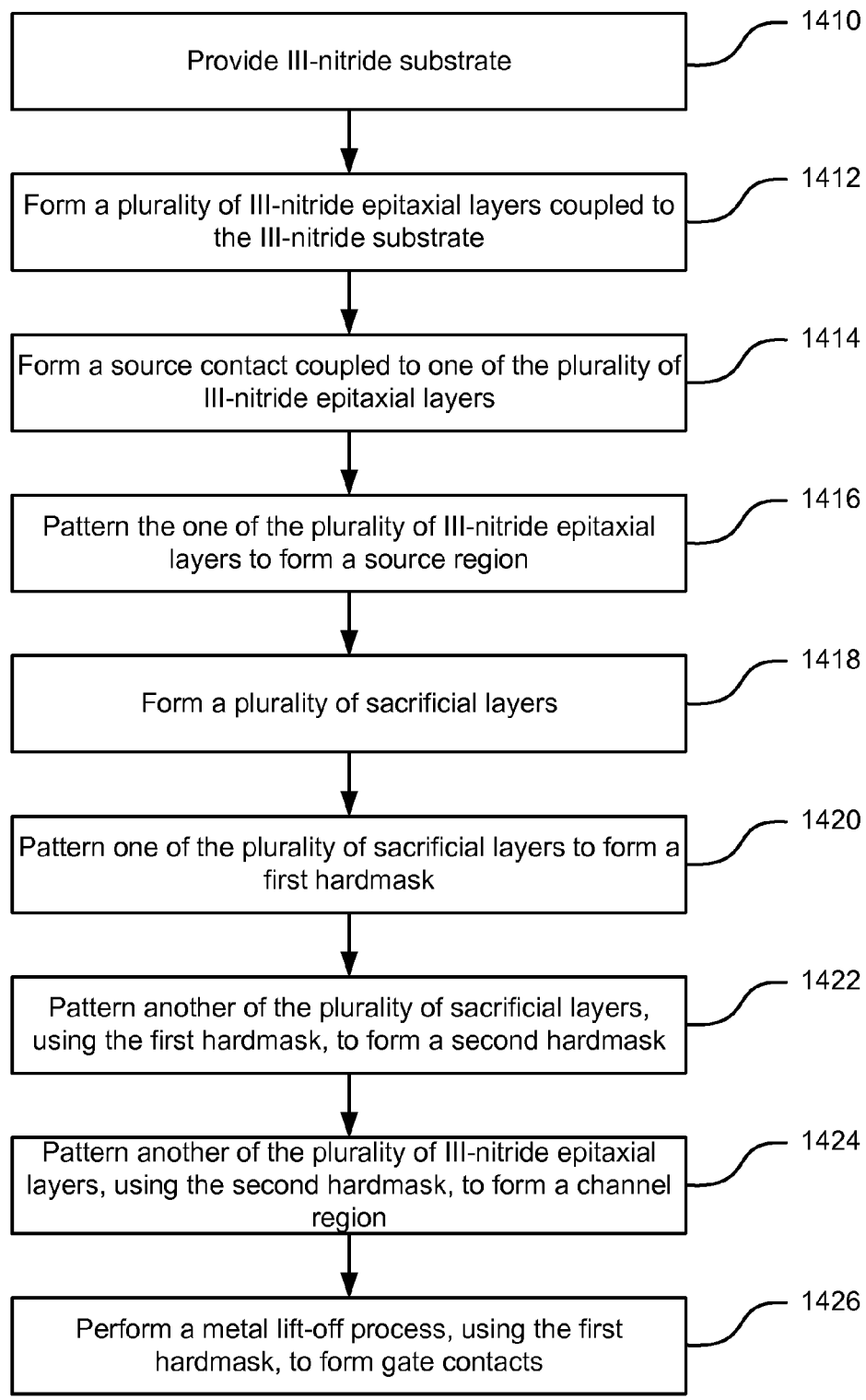
FIG. 14 is a simplified flowchart illustrating a method of fabricating a controlled switching device according to an embodiment of the present invention.

FIG. 14 is a simplified flowchart illustrating a method of fabricating a controlled switching device according to an embodiment of the present invention. The method includes providing a III-nitride substrate (1410) and forming a plurality of III-nitride epitaxial layers coupled to the III-nitride substrate (1412). The method also includes forming a source contact coupled to one of the plurality of III-nitride epitaxial layers (1414) and patterning the one of the plurality of III-nitride epitaxial layers to form a source region (1416).

Additionally, the method includes forming a first sacrificial layer, a second sacrificial layer, and third sacrificial layer (1418). The first sacrificial layer may include oxide materials or nitride materials. The second sacrificial layer may include a metallic material. The first sacrificial layer is coupled to another of the plurality of III-nitride epitaxial layers and can include an oxide, a nitride material, or the like. The method further includes patterning the third sacrificial layer to form a hardmask (1420), patterning the second sacrificial layer, and patterning the first sacrificial layer, using the hardmask, to form a second hardmask (1422). The third sacrificial material can include an oxide, a nitride, or the like. Patterning the second sacrificial layer may include forming a masking element having a lateral width less than a lateral width of at least the first hardmask or the second hardmask.

The method also includes patterning the another of the plurality of III-nitride epitaxial layers, using the second hardmask, to form a channel region (1424) and performing a metal lift-off process, using the hardmask, to form gate contacts (1426). The gate contacts can include a Schottky metal layer (e.g., nickel, platinum, palladium, titanium, gold, combinations thereof, or the like.) coupled to the another of the plurality of III-nitride epitaxial layers. Forming the Schottky metal layer can include using a photoresist mask in a liftoff process.

In some embodiments, the method may also include forming an interlevel dielectric layer coupled to the gate contacts and the source contact, which may provide electrical isolation between one or more overlying metallic contact layers. The method may also include forming a drain contact electrically coupled to the III-nitride substrate.

It should be appreciated that the specific steps illustrated in FIG. 14 provide a particular method of fabricating a controlled switching device according to an embodiment of the present invention. Other sequences of steps may also be performed according to alternative embodiments. For example, alternative embodiments of the present invention may perform the steps outlined above in a different order. Moreover, the individual steps illustrated in FIG. 14 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a vertical metal-semiconductor field-effect transistor (MESFET), the method comprising:
providing a gallium nitride (GaN) substrate;
forming a first n-type GaN epitaxial layer coupled to the GaN substrate, a second n-type GaN epitaxial layer coupled to the first n-type GaN epitaxial layer, and a third n-type GaN epitaxial layer coupled to the second n-type GaN epitaxial layer;
forming a metallic contact electrically coupled to the third n-type GaN epitaxial layer;
removing at least a portion of the third n-type GaN epitaxial layer to form a source region;

forming a plurality of sacrificial layers coupled to the second n-type GaN epitaxial layer;
patterning the plurality of sacrificial layers to provide an etch mask coupled to the second n-type GaN epitaxial layer;
forming a self-aligned channel region; and
forming one or more Schottky metal structures coupled to the self-aligned channel region.

2. The method of claim 1 wherein the one or more Schottky metal structures are also self-aligned.

3. The method of claim 1 wherein the first n-type GaN epitaxial layer is characterized by a first dopant concentration;
the second n-type GaN epitaxial layer is characterized by a second dopant concentration; and
the third n-type GaN epitaxial layer is characterized by a third dopant concentration greater than the first dopant concentration and the second dopant concentration.

4. The method of claim 1 wherein the Schottky metal structure comprises at least one of nickel, platinum, palladium, or gold.

5. The method of claim 1 wherein forming the Schottky metal structure comprises using a sacrificial mask in a liftoff process.

6. The method of claim 5 wherein the sacrificial mask comprises an etch mask used in the removing at least the portion of the second n-type GaN epitaxial layer and the third n-type GaN epitaxial layer.

7. The method of claim 1 further comprising:
forming a second metallic structure electrically coupled to the GaN substrate; and
forming a third metallic structure electrically coupled to the third n-type GaN epitaxial layer.

8. The method of claim 1 wherein a thickness of the first n-type GaN epitaxial layer is between about 1 µm and about 100 µm.

9. The method of claim 1 wherein at least one of the first dopant concentration, the second dopant concentration, or the third dopant concentration varies as a function of thickness.

10. A method for fabricating a controlled switching device, the method comprising:
providing a III-nitride substrate;
forming a plurality of III-nitride epitaxial layers coupled to the III-nitride substrate;
forming a source contact coupled to one of the plurality of III-nitride epitaxial layers;
patterning the one of the plurality of III-nitride epitaxial layers to form a source region;
forming a first sacrificial layer, a second sacrificial layer, and third sacrificial layer, wherein the first sacrificial layer is coupled to another of the plurality of III-nitride epitaxial layers;
patterning the third sacrificial layer to form a hardmask;
patterning the second sacrificial layer;
patterning the first sacrificial layer, using the hardmask, to form a second hardmask;
patterning the another of the plurality of III-nitride epitaxial layers, using the second hardmask, to form a channel region; and
performing a metal lift-off process, using the hardmask, to form gate contacts.

11. The method of claim 10 further comprising forming an interlevel dielectric layer coupled to the gate contacts and the source contact.

12. The method of claim 10 wherein the first sacrificial layer and the third sacrificial layer comprise at least one of an oxide or a nitride.

13. The method of claim 10 wherein the second sacrificial layer comprises at least one of a metallic material or a material characterized by etch selectivity between sacrificial layers.

14. The method of claim 10 wherein patterning the second sacrificial layer comprises forming a masking element having a lateral width less than a lateral width of at least the first hardmask or the second hardmask.

15. The method of claim 10 wherein the gate contacts comprise a Schottky metal layer coupled to the another of the plurality of III-nitride epitaxial layers.

16. The method of claim 15 wherein the Schottky metal layer comprises at least one of nickel, platinum, palladium, or gold.

17. The method of claim 10 further comprising forming a drain contact electrically coupled to the III-nitride substrate.

18. The method of claim 10 wherein forming the Schottky metal layer comprises using a sacrificial mask in a liftoff process.

19. The method of claim 10 wherein a thickness of the first III-nitride epitaxial layer is between about 1 µm and about 100 µm.

20. The method of claim 19 wherein the thickness is between about 3 µm and 20 µm.

21. The method of claim 10 wherein at least one of the first dopant concentration, the second dopant concentration, or the third dopant concentration is non-uniform as a function of thickness.

* * * * *